United States Patent [19]
Ozaki et al.

[11] Patent Number: 5,610,094
[45] Date of Patent: Mar. 11, 1997

[54] PHOTOELECTRIC CONVERSION DEVICE

[75] Inventors: Masaharu Ozaki, Yokohama; Takao Yonehara, Atsugi, both of Japan

[73] Assignee: Canon Kabushiki Kaisha, Tokyo, Japan

[21] Appl. No.: 475,830

[22] Filed: Jun. 7, 1995

Related U.S. Application Data

[63] Continuation of Ser. No. 270,304, Jul. 5, 1994, abandoned, which is a continuation of Ser. No. 93,437, Jul. 8, 1993, abandoned, which is a continuation of Ser. No. 970,234, Nov. 2, 1992, abandoned, which is a continuation of Ser. No. 815,846, Dec. 31, 1991, abandoned, which is a continuation of Ser. No. 361,830, Jun. 5, 1989, abandoned, which is a continuation of Ser. No. 70,778, Jul. 7, 1987, abandoned.

[30] Foreign Application Priority Data

Jul. 11, 1986 [JP] Japan .................................. 61-162129

[51] Int. Cl.$^6$ ................................................ H01L 27/02
[52] U.S. Cl. ............................ 437/62; 437/83; 437/915; 148/DIG. 152; 148/DIG. 164
[58] Field of Search ........................... 437/62, 83, 915; 148/DIG. 152, DIG. 164

[56] References Cited

U.S. PATENT DOCUMENTS

| | | | |
|---|---|---|---|
| 3,620,833 | 11/1971 | Gleim et al. | 437/62 |
| 4,340,819 | 7/1982 | Ogasawara et al. | 250/211 J |
| 4,471,371 | 9/1984 | Hamano | 357/31 |
| 4,472,729 | 10/1984 | Shibata et al. | 357/59 |
| 4,651,016 | 3/1987 | Hirao | 250/211 J |
| 4,686,554 | 8/1987 | Ohmi et al. | 357/30 |
| 4,686,758 | 8/1987 | Liu et al. | 357/59 |
| 4,751,561 | 6/1988 | Jastrzebski | 357/4 |
| 4,977,096 | 12/1990 | Shimada et al. | 437/83 |
| 4,983,539 | 1/1991 | Yamagata et al. | 437/83 |
| 4,999,313 | 3/1991 | Arikawa et al. | 437/83 |
| 5,008,206 | 4/1991 | Shinohara et al. | 437/83 |
| 5,010,033 | 4/1991 | Tokunaga et al. | 437/83 |
| 5,013,670 | 5/1991 | Arikawa et al. | 437/2 |

FOREIGN PATENT DOCUMENTS

| | | | |
|---|---|---|---|
| 020135 | 12/1980 | European Pat. Off. | 357/4 |
| 57-106181 | 7/1982 | Japan | 357/19 |
| 58-92254 | 6/1983 | Japan | 357/43 |
| 178662 | 9/1985 | Japan . | |
| 60-178662 | 9/1985 | Japan | 357/4 |
| 2113465 | 8/1983 | United Kingdom | 357/4 |
| 2116067 | 9/1983 | United Kingdom | 357/4 |
| 2183090 | 5/1987 | United Kingdom . | |

OTHER PUBLICATIONS

Wolf, S., Tauber, R.; *Silicon Processing for the VLSI Era vol. I: Process Technology* (1986) pp. 280–283 & 288–292.
"Single-crystal films of silicon on insulators" by J. D. Filby et al., Brit. J. Appl. Phys., 1967, vol. 18, pp. 1357–1382.
T. Yonehara, et al., "Competing Processes of Si Molecular Beam Reactive Etching and Simultaneous Deposition On Film and Bulk $SiO_2$", Journal of Applied Physics, vol. 53, No. 10, pp. 6839–6843 (Oct. 1982).
S. Kataoka, "An Attempt Towards an Artificial Retina: 3–D IC Technology For An Intelligent Image Sensor", Transducers '85, 1985 Int'l Conf. on Solid State Sensors and Actuators Digest of of Technical Papers, IEEE, pp. 440–442.
W. A. P. Clausen, "The Nucleation of CVD Silicon on $SiO_2$ and $Si_3N_4$ Substrates", Journal of the Electrochemical Society, vol. 128, No. 6, Jun. 1981, pp. 1353–1359.

Primary Examiner—Robert Kunemund
Attorney, Agent, or Firm—Fitzpatrick, Cella, Harper & Scinto

[57] ABSTRACT

A photoelectric conversion device of the type having a photosensor region and a circuit section for processing at least an output signal from the photosensor region, wherein on a first layer formed with an electronic element constituting the circuit section, a second layer with a deposition surface is formed directly or through an interposed insulation layer, and wherein at least one of the electronic element and the photosensor is formed in a crystal layer which has grown from a single nucleus formed on a nucleus forming region on the deposition surface of the second layer, the single nucleus being sufficiently fine for making only a single crystal grow and having a sufficiently high nucleation density than that of the material of the second layer surface.

14 Claims, 11 Drawing Sheets

5,610,094

PHOTOELECTRIC CONVERSION DEVICE

This application is a continuation of application Ser. No. 08/270,304 filed Jul. 5, 1994, now abandoned, which is a continuation of application Ser. No. 08/093,437 filed Jul. 8, 1993, now abandoned, which is a continuation of application Ser. No. 07/970,234 filed Nov. 2, 1992, now abandoned, which is a continuation of application Ser. No. 07/815,846 filed Dec. 31, 1991, now abandoned, which is a continuation of application Ser. No. 07/361,830 filed Jun. 5, 1989, now abandoned, which is a continuation of application Ser. No. 07/070,778 filed Jul. 7, 1987, now abandoned.

BACKGROUND OF THE INVENTION

1. Field of the Invention

The present invention relates to a photoelectric conversion device formed by using a crystal layer which is formed by a crystal growth method for selectively growing a crystal with the aid of a difference of nucleation densities between a deposition film forming material and a surface material on which a deposition film is formed.

2. Related Background Art

Research and development on a three-dimensional integrated circuit are now being vigorously pursued to achieve high integration and multi-functions by laying semiconductor elements one upon another in the vertical direction of the substrate.

To fabricate a three-dimensional integrated circuit, it is necessary to form on an amorphous insulator a semiconductor thin film in which electronic elements such as transistors are formed. However, in general, only amorphous silicon or polysilicon can grow on an amorphous material.

Therefore, amorphous silicon or polysilicon have been used heretofore as a semiconductor layer for electronic elements, or alternatively monocrystalline silicon has been used which is formed by melting and monocrystallizing grown amorphous silicon or polysilicon with a laser beam.

Use of amorphous silicon or polysilicon as a semiconductor layer for electronic elements, however, results in a low electron mobility: lower than 0.1 cm$^2$/V sec for amorphous silicon and 1 to 10 cm$^2$/V sec for polysilicon having a grain diameter of several hundreds angstroms. In addition, a large leakage current flows through a PN junction. Thus, electronic elements having a good performance cannot be realized.

Apart from the above, since a monocrystalline silicon layer is used as a semiconductor layer in the method of melting and monocrystallizing the amorphous silicon or polysilicon, electronic elements of good performance can be realized. However, heating and melting with a laser beam greatly influence the performance of elements formed in an under layer.

SUMMARY OF THE INVENTION

It is an object of the present invention to solve the above problems and provide a photoelectric conversion device of multi-layer integrated circuit structure having electronic elements and optical sensors of high performance, using a monocrystal or a polycrystal.

It is another object of the present invention to provide a photoelectric conversion device of the type having a photosensor region and a circuit section for processing at least an output signal from the photosensor region, wherein on a first layer formed with an electronic element constituting the circuit section, a second layer with a deposition surface is formed directly or through an interposed insulation layer, and wherein at least one of the electronic element and the photosensor is formed in a crystal layer which has grown from a single nucleus formed on a nucleus forming region on the deposition surface of the second layer, the single nucleus being sufficiently small for making only a single crystal grow and having a sufficiently high nucleation density compared to that of the material of the second layer surface.

DETAILED DESCRIPTION OF THE PREFERRED EMBODIMENTS

For a better understanding of the present invention, first the general process for forming a thin film of metal for a semiconductor is explained.

When the deposition surface is made of a material different in kind from the flying atom, particularly an amorphous material, the flying atoms are diffused freely on the substrate surface, or again evaporated (released). And, as the result of mutual collision between the atoms, a nucleus is formed and when its size becomes the size rc (=−2 σo/gv) at which its free energy G becomes the maximum (critical nucleus), G is reduced and the nucleus continues to grow stably three-dimensionally to become shaped in the form of an island. A nucleus with a size exceeding rc is called a stable nucleus, and unless otherwise particularly noted, "nucleus" in the following detailed description of the present invention refers to this "stable nucleus". Also, among "stable nucleus", those with small r are called an "initial nucleus".

The free energy generated by formation of nucleus is represented as follows:

$$G = 4\pi f(\theta)(\sigma o \cdot r^2 + \tfrac{1}{3} g v \cdot r^3)$$

$$f(\theta) = \tfrac{1}{4}(2 - 3\cos\theta + \cos^2\theta)$$

wherein, r: radius curvature of the nucleus

θ: contact angle of the nucleus gv: free energy per unit deposition

σo: surface energy between the nucleus and a vacuum.

Figure 1:
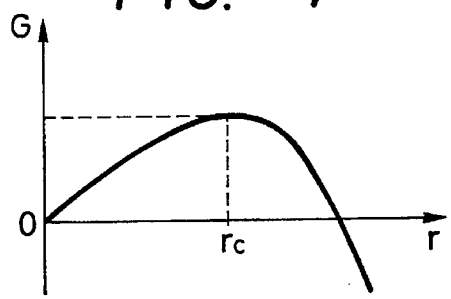
FIG. 1 is a graph for illustration of the relationship between the size of nucleus, rc and free energy, G, in the process of forming a thin film.

FIG. 1 shows the manner in which G is changed. In the same Figure, the radius of curvature of the stable nucleus when G is at the maximum value is rc.

Thus, nuclei grow to become shaped in islands, and further grow whereby mutual contact between islands progresses until sometimes coalescence occurs and via a network structure, it becomes finally a continuous film to completely cover the substrate surface. Following such a process, a thin film is deposited on the substrate.

In the deposition process as described above, the density of the nucleus formed per unit area of the substrate surface, the size of nucleus, and the nucleation speed are determined by the state of the system of deposition, and particularly by the interaction between the flying atoms and the substrate surface material. Also, a specific crystal direction grows in parallel to the substrate due to anisotropy relative to the crystal surface of the interface energy at the interface between the deposited material and the substrate, and when the substrate is amorphous, the crystal direction within the substrate plane is not constant. For this reason, grain boundaries are formed by mutual collision between nuclei or islands, and particularly in the case of mutual collision between islands with some sizes or greater, instead of coalescing grain boundaries are formed. Since the grain boundaries formed are difficulty to move in the solid phase, the grain sizes are determined at that point.

Next, the selective deposition method for forming a deposited film selectively on the deposition surface is described. The selective deposition method is a method in which a thin film is formed selectively on the substrate by utilizing the differences between the materials and factors influencing nucleus formation in the thin film forming process, such as surface energy, attachment coefficient, release coefficient, surface diffusion speed, etc.

Figure 2A:
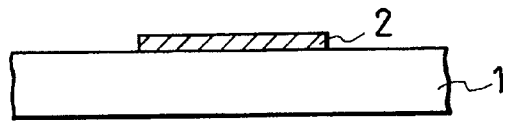
FIGS. 2A and 2B are illustrations of the selective deposition method of the present invention.
Figure 2B:
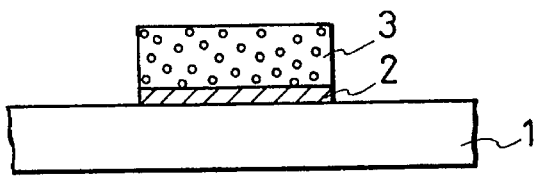

FIGS. 2A and 2B are illustrations of the selective deposition method. First, as shown in FIG. 2A on the substrate 1, a thin film 2 comprising a material different with respect to the above factors from the substrate 1 is formed at a desired portion. And, when deposition of a thin film comprising an appropriate material is effected under appropriate deposition conditions, a thin film 3 grows only on the thin film 2, whereby it is possible to give rise to a phenomenon that no growth occurs on the substrate 1. By utilizing this phenomenon, the thin film 3 formed self-matchingly can be grown, whereby it becomes possible to omit the lithographic step by use of a resist as practiced in the prior art.

As the material for enabling deposition according to such selective formation method, for example, $SiO_2$ may be used as the substrate 1, Si, GaAs, silicon nitride as the thin film 2 and Si, W, GaAs, InP, etc., as the thin film 3 to be deposited.

Figure 3:
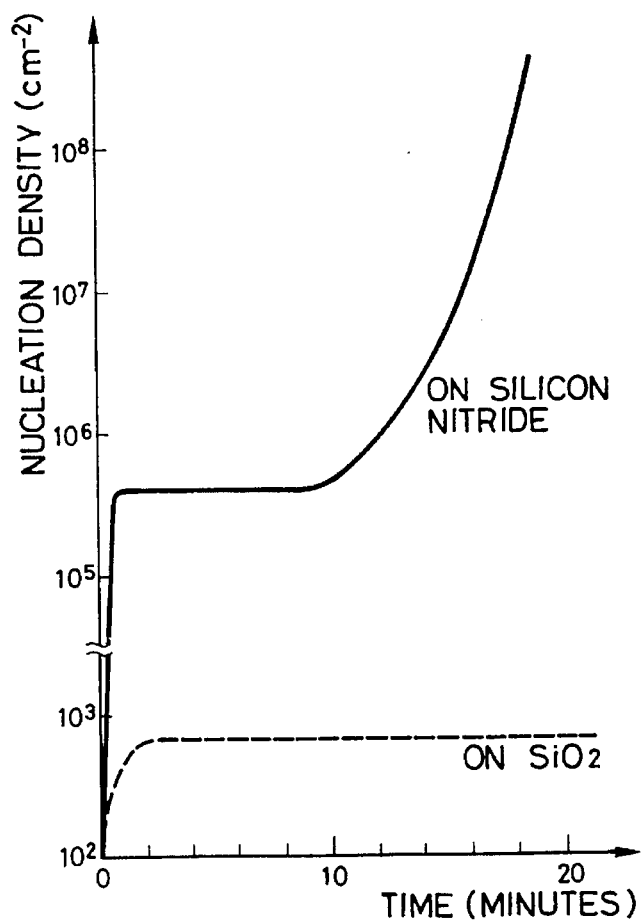
FIG. 3 is a graph showing the change with lapse of time of nucleation density (ND) on the deposition surface of $SiO_2$ and ON the deposition surface of silicon nitride.

FIG. 3 is a graph showing the change with lapse of time of nucleation density on the deposited surface of $SiO_2$ and the deposited surface of silicon nitride.

As shown in the graph, soon after initiation deposition, the nucleation density on $SiO_2$ is saturated at $10^3$ $cm^{-2}$ or less, and the value is not substantially changed even after 20 minutes.

In contrast, on silicon nitride ($Si_3N_4$), it is initially saturated at about $4 \times 10^5$ $cm^{-2}$ or less, is not substantially changed 10 minutes thereafter, but is abruptly increased thereafter. This measurement example shows the case in which $SiCl_4$ gas is diluted with $H_2$ and deposited according to the CVD method under the conditions of a pressure of 170 Torr and a temperature of 1000° C. Otherwise, the same action can be obtained by use of $SiH_4$, $SiH_2Cl_2$, $SiHCl_3$, $SiF_4$, etc., as the reaction gas, and controlling the pressure, temperature, etc. Also, the vacuum vapor deposition can be employed.

In this case, nucleation on $SiO_2$ poses substantially no problem, but by addition of HCl gas into the reaction gas, nucleation on $SiO_2$ can be further suppressed to make deposition of Si on $SiO_2$ perfectly zero.

Such a phenomenon depends greatly on the difference in adsorption coefficient, release coefficient, surface diffusion coefficient, etc., relative to Si of the material surfaces of $SiO_2$ and silicon nitride, but the fact that $SiO_2$ itself is etched by the reaction of $SiO_2$ with Si atom itself to form silicon monooxide with a higher vapor pressure, while no such etching phenomenon occurs on silicon nitride may be also considered to be a cause to effect selective deposition (T. Yonehara, S. Yoshioka, S. Miyazawa, Journal of Applied Physics 53, 6839, 1982).

Thus, by selecting $SiO_2$ and silicon nitride as the materials of the deposition surface and silicon as the material to be deposited, a sufficiently great nucleation density difference as shown in the same graph can be obtained. Here, although $SiO_2$ is desirable as the material for the deposition surface, this is not limiting and a sufficiently practical nucleation density difference can be obtained even by use of $SiO_x$ (0<x<2).

Of course, the present invention is not limited to these materials, but the difference in nucleation density (ΔND) may be sufficiently $10^3$-fold or more in density of nuclei as shown by the same graph, and sufficient selective formation of deposited film can be done with the materials as exemplified below.

As another method for obtaining this nucleation density difference (ΔND), ions of Si or N may be injected locally into the $SiO_2$ surface to form a region having excessive Si or N.

The present invention utilizes selective deposition based on such nucleation density difference (ΔND) and, by being formed sufficiently small so that a single nucleus may grow on the deposition surface of a different kind of material having sufficiently greater nucleation density than the material of the deposition surface, a single crystal can be grown selectively only at the site where such small different kind of material exists.

In this connection, since selective growth of a single crystal is determined depending on the electron state of the deposition surface, particularly the state of dangling bonds, the material with lower nucleation density (for example, $SiO_2$) is not required to be a bulk material, but it may be formed only on the surface of any desired material, substrate, etc., to form the above deposited surface.

In the following, the present invention is described in detail by referring to the drawings.

Figure 4A:
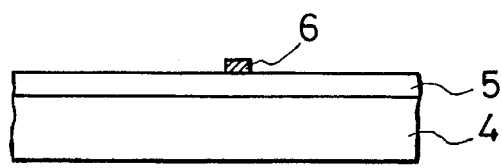
FIGS. 4A to 4D are illustrations of the formation steps showing a first embodiment of the method for forming a crystal relating to the present invention.
Figure 4B:
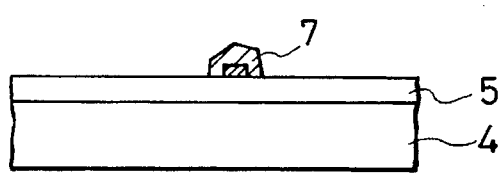
Figure 4C:
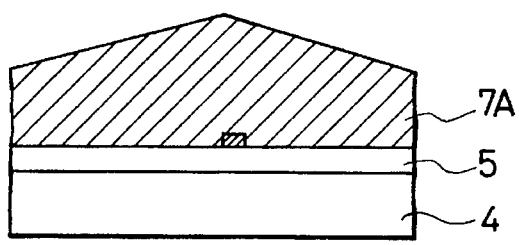
Figure 4D:
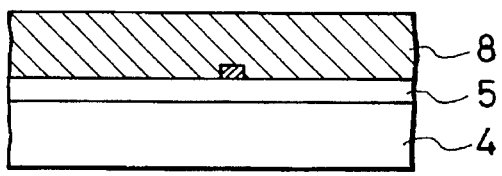
Figure 5A:
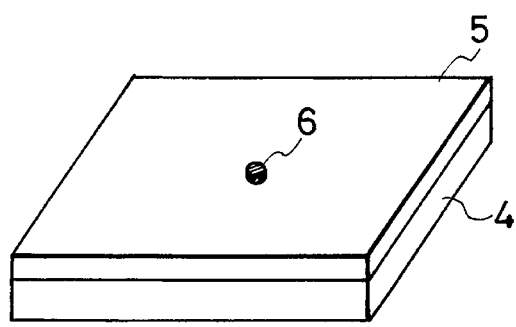
FIGS. 5A and 5B are perspective views of the substrate in FIGS. 4A and 4D.
Figure 5B:
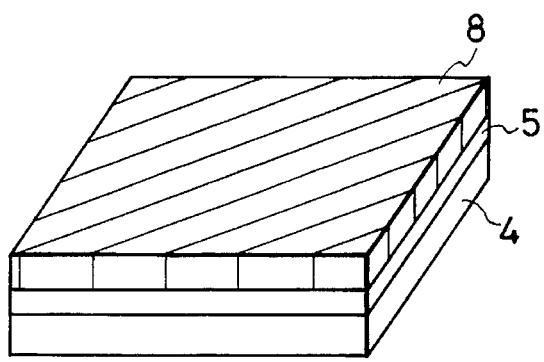

FIGS. 4A to 4D are illustrations of the formation steps showing a first embodiment of the method for forming a crystal relating to the present invention, and FIGS. 5A and 5B are perspective views of the substrates in FIGS. 4A and 4D. First, as shown in FIG. 4A and FIG. 5A, on the substrate 4, a thin film 5 [deposition surface ($S_{NDS}$)] with small nucleation density which enables selective deposition is formed and a material different from the material forming the thin film 5 with greater nucleation density is deposited thinly, followed by patterning according to lithography, etc., to form a sufficiently small deposition surface 6 ($S_{NDL}$) (or called "Seed") comprising a different kind of material. However, the size, the crystal structure, and the composition of the substrate 4 may be any desired ones, and a substrate having a functional device formed thereon prepared according to conventional semiconductor technique may be employed. Also, the deposition surface ($S_{NDL}$) 6 comprising a different kind of material is also inclusive of modified regions having excessive Si or N formed by ion injection of Si or N into the thin film 5 as described above.

Next, by selection of appropriate deposition conditions, a single crystal of a thin film material is formed only on the deposition surface ($S_{NDL}$) 6. That is, the deposition surface ($S_{NDL}$) 6 is required to be formed sufficiently small so that only a single nucleus may be formed thereon. The size of the deposition surface ($S_{NDL}$) 6, which may differ depending on the kind of the material, may be several microns or less. Further, the nucleus grows while maintaining a single crystal structure to become a single crystal grain 7 in the shape of an island as shown in FIG. 4B. For forming an island-shaped single crystal grain 7, it is desirable to determine the conditions so that no nucleation may occur at all on the thin film 5, as already mentioned.

The island-shaped single crystal grain 7 further grows while maintaining the single crystal structure with the deposition surface ($S_{NDL}$) 6 as the center (lateral overgrowth), whereby it can cover over the whole thin film 5 as shown in FIG. 4C (single crystal 7A).

Subsequently, if necessary, the single crystal 7A is flattened by etching or polishing, and a single S crystal layer 8 capable of forming a desired device can be formed on the thin film 5 as shown in FIG. 4D and FIG. 5B.

For forming the thin film 5 forming the nonnucleation surface ($S_{NDS}$) on the substrate 4, any desired material can be used for the substrate 4 which is the supporting member. Further, in such a case, even when the substrate 4 may be one having a functional device, etc., formed thereon according to conventional semiconductor technique, the single crystal layer 8 can be easily formed thereon.

In the above embodiment, the nonnucleation surface ($S_{NDS}$) is formed of thin film 5, but a substrate comprising a material with small nucleation density (ND) enabling selective nucleation may be used as such and nucleation surfaces ($S_{NDL}$) may be provided at any desired positions to form single crystal layers similarly thereon.

Figure 6A:
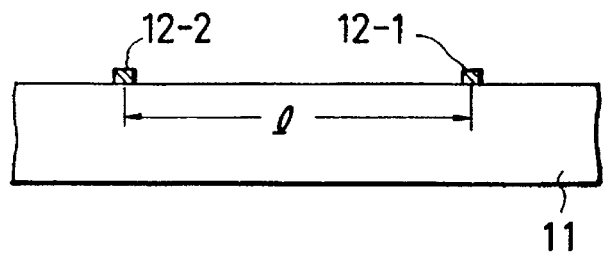
FIGS. 6A to 6D are illustrations of the formation steps showing a second embodiment of the method for forming a single crystal relating to the present invention.
Figure 6B:
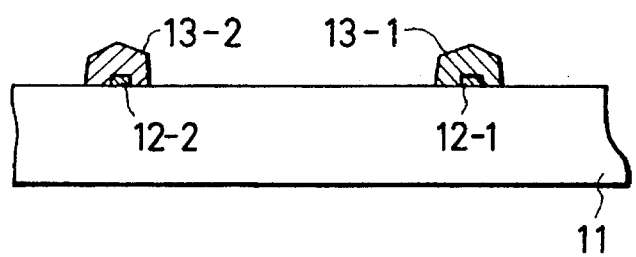
Figure 6C:
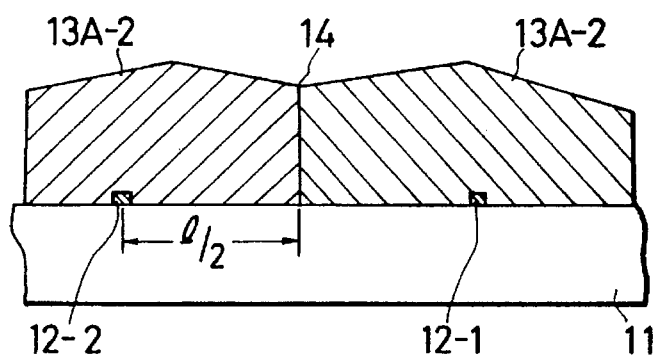
Figure 6D:
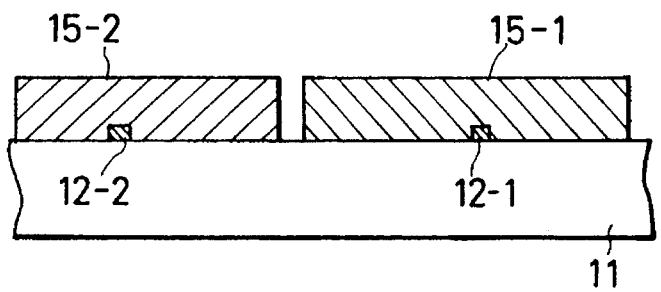
Figure 7A:
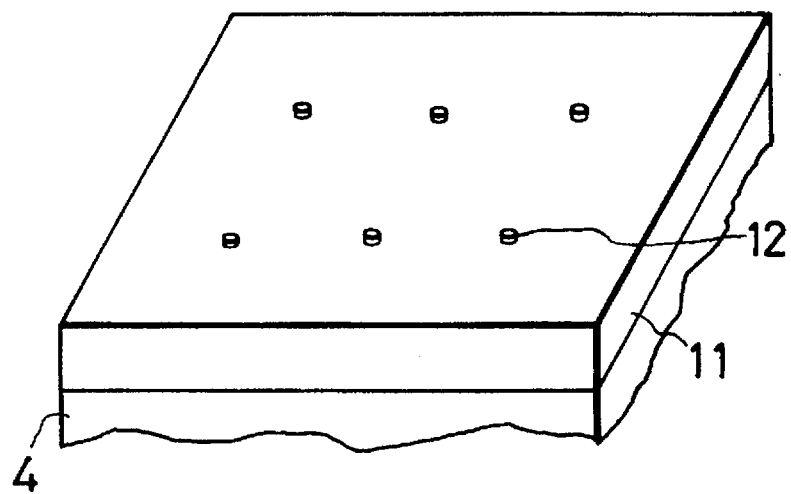
FIGS. 7A and 7B are perspective views of the substrates in FIGS. 6A and 6D.
Figure 7B:
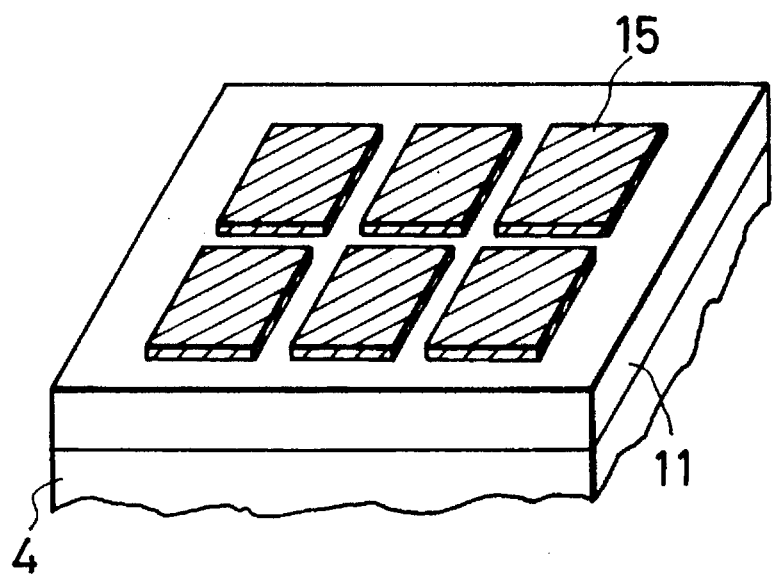
Figure 8A:
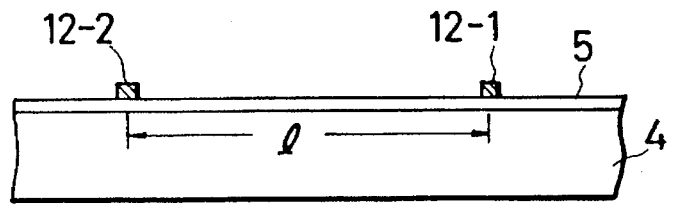
FIGS. 8A to 8D are illustrations of the steps for forming a crystal showing a third embodiment of the method for forming a crystal relating to the present invention.
Figure 8B:
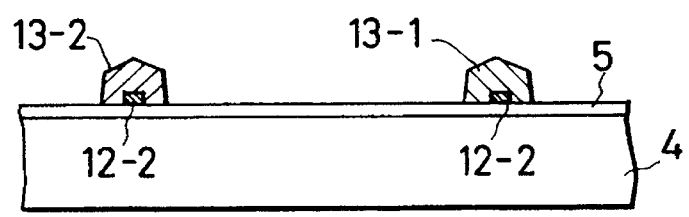
Figure 8C:
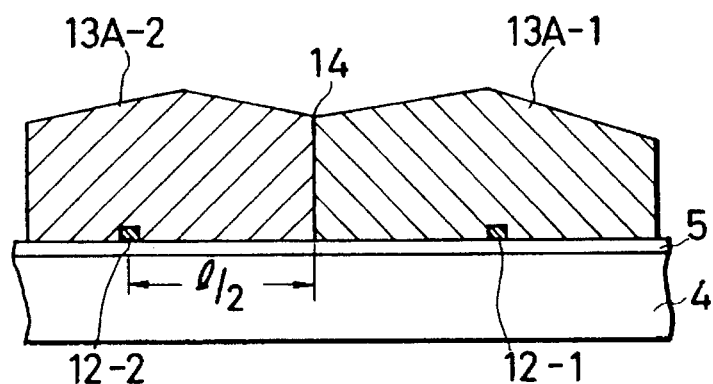
Figure 8D:
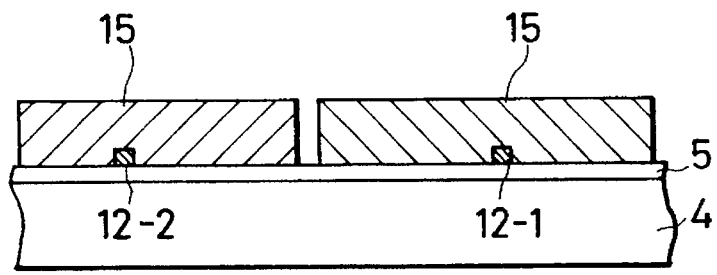

FIGS. 6A–6D are illustrations of the formation steps showing a second embodiment of the method for forming a crystal relating to the present invention, and FIGS. 7A and 7B are perspective views of the substrates in FIGS. 6A and 6D.

As shown in FIG. 6A and FIG. 7A, on the amorphous insulating substrate 11, with an interval of a distance l, nucleation surfaces ($S_{NDL}$) 12-1, 12-2 of a material different from the substrate 11 enabling the above selective nucleation are arranged to be sufficiently small. The distance l is set equal to the size of the single crystal region required for formation of semiconductor device or group of devices or greater.

Next, by selecting appropriate crystal forming conditions, on the nucleation surfaces ($S_{NDL}$) 12-1, 12-2 only a nucleus of a crystal forming material is formed. That is, the nucleation surfaces 12-1, 12-2 are required to be formed to a sufficiently small size (area) to the extent that only a single nucleus may be formed. The size of the nucleation surfaces ($S_{NDL}$) 12-1, 12-2, which may be different depending on the kind of the material, may be several microns or less. Further, the nucleus grows while maintaining the single crystal structure, and become island-shaped single crystal grains 13-1, 13-2 as shown in FIG. 6B. For forming island-shaped single crystal grains 13-1, 13-2, it is desirable to determine the conditions so that no nucleation may occur at all on surfaces other than the nucleation surfaces ($S_{NDL}$) on the substrate 11.

The crystal direction in the normal line direction of the substrate 11 of the island-shaped single crystal grains 13-1, 13-2 is determined so as to make the interface energy of the material of the substrate 11 and the material forming nucleus a minimum. In addition, the surface or interface energy has anisotropy depending on the crystal face. However, as already mentioned, the crystal direction within the substrate plane in amorphous substrate is not determined.

The island-shaped single crystal grains 13-1, 13-2 further grow to become single crystals 13A-1, 13A-2 until the adjacent single crystals 13A-1, 13A-2 contact each other as shown in FIG. 6C, but since the crystal direction within the substrate plane is not constant, a crystal grain boundary 14 is formed at the intermediate position between the nucleation surfaces ($S_{NDL}$) 12-1 and 12-2.

Subsequently, the single crystals 13A-1, 13A-2 grow three-dimensionally, but crystal faces with slow growth speed appear. For this reason, the surfaces of single crystals 13A-1, 13A-2 are flattened by etching or polishing, and further the portion of the grain boundary 14 is removed to form thin films of single crystals 15-1, 15-2 containing no grain boundary in the shape of lattices as shown in FIG. 6D and FIG. 7B. The size of the single crystal films 15-1, 15-2, 15 is determined by the interval l between the nucleation surfaces ($S_{NDL}$) as described above. That is, by determining appropriately the formation pattern of the nucleation surface ($S_{NDL}$) 12, the position of the grain boundary can be controlled to form single crystals with desired sizes at a desired arrangement.

FIGS. 8A–8D are illustration of the steps for forming crystal showing a third embodiment of the method for forming the crystal relating to the present invention. As shown in these figures, similar to the first embodiment, a nonnucleation surface ($S_{NDS}$) 5 shaped in a thin film, comprising a material with small nucleation density (ND) enabling selective nucleation, is formed on a desired substrate 4, and a nucleation surfaces ($S_{NDL}$) 12 comprising a different material with greater nucleation density (ND) are formed at intervals of l thereon, whereby single crystal layers 15 can be formed similarly as in the above third embodiment.

Figure 9A:
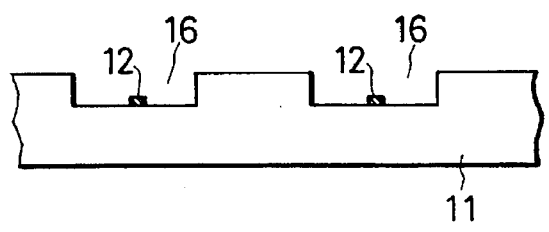
FIGS. 9A to 9C are illustrations of formation steps showing a fourth embodiment of the method for forming a crystal relating to the present invention.
Figure 10A:
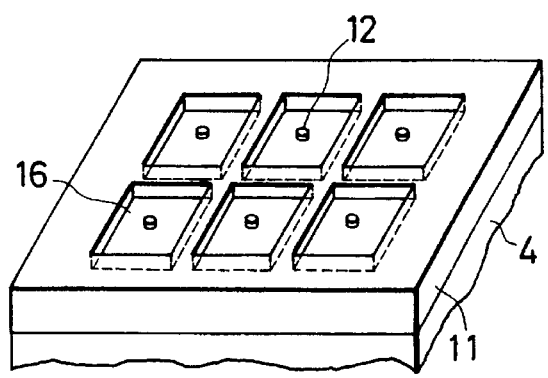
FIGS. 10A to 10B are perspective views of the substrates shown in FIGS. 9A and 9C.
Figure 9B:
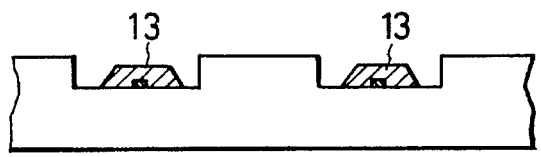
Figure 10B:
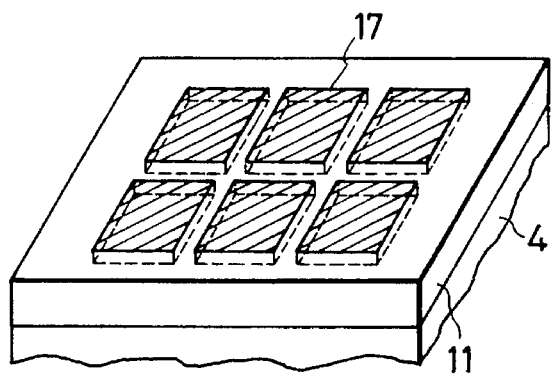
Figure 9C:
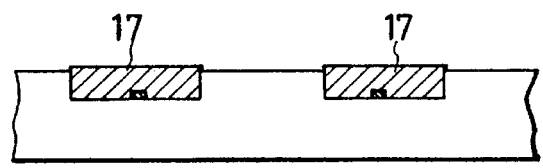

FIGS. 9A–9C are illustrations of the formation steps showing a fourth embodiment of the method for forming the crystal relating to the present invention, and FIGS. 10A and 10B are perspective views of the substrates in FIGS. 9A and 9C. First, as shown in FIG. 9A and FIG. 10A, concavities 16 with desired size and shape are formed on the amorphous insulating substrate 11, and nucleation surfaces ($S_{NDL}$) 12 with a sufficiently small size for forming only a single nucleus therein.

Subsequently, as shown in FIG. 9B, island-shaped single crystal grains 13 are grown similarly as in the first embodiment.

And, as shown in FIG. 9C and FIG. 10B, single crystal grains 13 are grown until embedding the concavity 16 to form a single crystal layer 17.

In this embodiment, since single crystal grains 13 grow within the concavity 16, the steps of flattening and removing the grain portion become unnecessary.

Figure 11A:
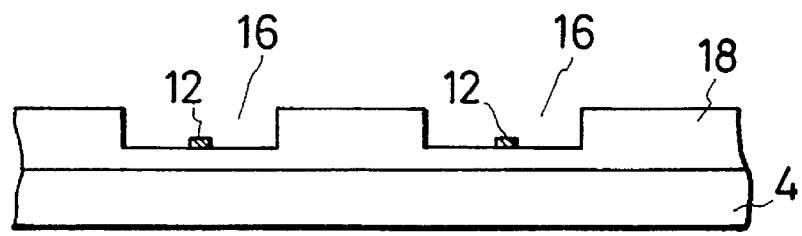
FIGS. 11A to 11C are illustrations of the steps for forming a crystal showing a fifth embodiment of the method for forming a crystal relating to the present invention.
Figure 11B:
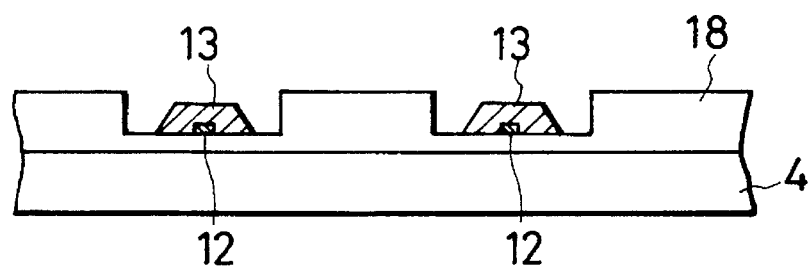
Figure 11C:
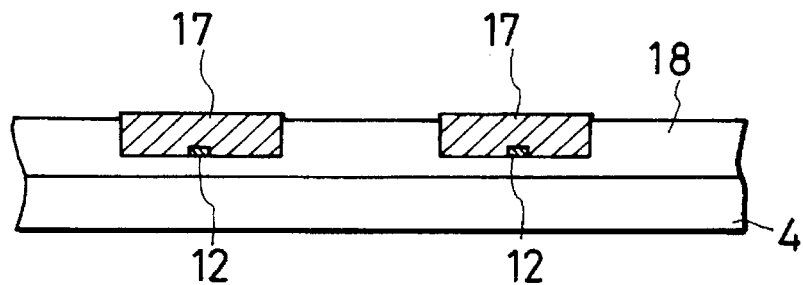

FIGS. 11A–11C are steps for forming a crystal of a fifth embodiment of the present invention. As shown in the same Figure, on any desired substrate 4 similar to the first embodiment, a nonnucleation surface ($S_{NDS}$) shaped in thin film 18 comprising a material with small nucleation density (ND) enabling selective nucleation is formed, and a concavity 16 with desired size and shape is formed thereon. And, a nucleation surface ($S_{NDL}$) 12 comprising a material different from the material forming the nonnucleation surface ($S_{NDS}$) with greater nucleation density (ND) is formed therein, and a single crystal layer 17 is formed similar to the fifth embodiment.

FIGS. 12A–12D are illustrations of the steps for forming a crystal of a sixth embodiment of the present invention.

Figure 12A:
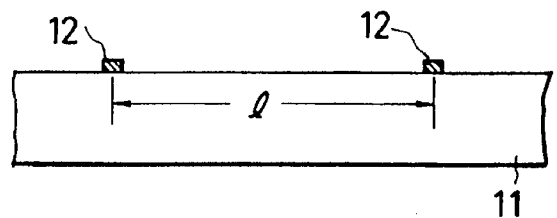
FIGS. 12A to 12D are illustrations of the steps for forming a crystal showing an sixth embodiment of the method for forming a crystal relating to the present invention.
Figure 12B:
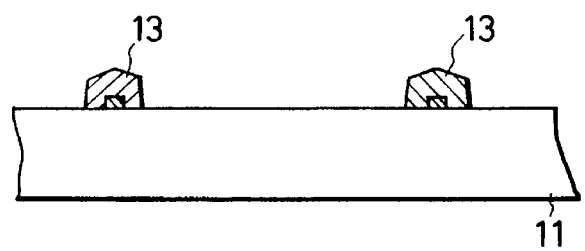
Figure 12C:
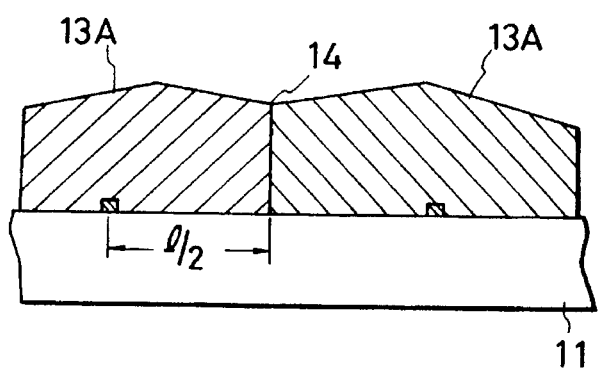
Figure 12D:
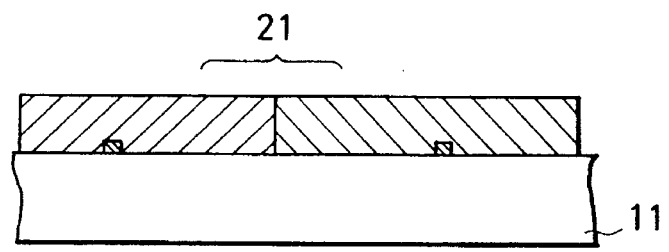

FIGS. 12A2–12C are the same as FIGS. 6A–6C. That, is, a plurality (two in the Figure) of nucleation surfaces 12 are formed with an interval of l, and single crystal grains 13 subjected to overgrowth on the nucleation surfaces 12 are formed. By permitting the single crystal grains 13 to further grow to form single crystals 13A, a grain boundary 14 is formed approximately at the center between the nucleation surfaces ($S_{NDL}$), and by flattening the surface of single crystal 13A, a polycrystalline layer 21 with regular grains sizes which are approximately equal to l as shown in FIG. 12D can be obtained.

Since the grain size of the polycrystalline layer 21 is determined by the interval l between the nucleation surfaces ($S_{NDL}$) 12, it becomes possible to control the grain size of the polycrystal. In the prior art, the grain size of a polycrystal was changed by a plurality of factors such as the formation method, formation temperature, etc., and also when preparing a polycrystal with large grain size, it had a grain size distribution with a considerable width. However, according to the present invention, the grain size and grain size distribution can be determined with good controllability of the interval l between the nucleation surfaces 12.

Of course, as shown in FIGS. 9A to 9C, the above polycrystal layer 21 may be formed by forming a nonnucleation surface ($S_{NDS}$) 5 with small nucleation density (ND) on a desired substrate 4 and nucleation surfaces ($S_{NDL}$) 12-1, 12-2 with greater nucleation density (ND). In this case, as already mentioned, the substrate material and structure are not limited, but the polycrystal layer 21 can be formed by controlling the grain size and the grain size distribution.

Next, the specific method for forming a single crystal layer or a polycrystal layer in the above respective embodiments is described in more detail by referring primarily to the second embodiment shown in FIG. 6 and the sixth embodiment shown in FIG. 12.

By thermal oxidation of a Si single crystal wafer to form $SiO_2$ on the surface, a substrate 11 is obtained with its surface being formed into non-nucleation surface ($S_{NDS}$). Of course, a quartz substrate which is a material with a small nucleation density (ND) can be also used as the substrate 11, or alternatively a nonnucleation surface ($S_{NDS}$) may be provided by forming an $SiO_2$ layer on the surface of any desired base substrate such as metal, semiconductor, magnetic material, piezoelectric material, insulator, etc., by the use of the sputtering method, the CVD method, the vacuum vapor deposition method, etc. Also, as the material forming nonnucleation surface ($S_{NDS}$), $SiO_2$ is desirable but $SiO_x$ (0<x<1) with the value of x being varied may be also employed.

On the $SiO_2$ layer of the substrate 11 having the $SiO_2$ layer thus formed on the surface is deposited a silicon nitride layer (e.g. $Si_3N_4$ layer) or a polycrystalline silicon layer according to the reduced pressure chemical vapor deposition method, and subsequently the silicon nitride layer or polycrystalline silicon layer is subjected to patterning according to conventional lithographic technique or a lithographic technique using an X-ray, electron beam or ion beam, whereby nucleation surfaces ($S_{NDL}$) 12 having small area of preferably 10 µm or less, more preferably several micron or less, optimally about 1 µm or less,. are obtained.

Subsequently, by use of $SiH_2Cl_2$, $SiCl_4$, $SiHCl_3$, $SiF_4$ or $SiH_4$, or a gas mixture thereof, optionally mixed with HCl, $H_2$ or a gas mixture thereof, Si single crystal is selectively grown on the above substrate 11.

The substrate temperature, pressure, etc., may be conveniently determined, but the substrate temperature may be preferably 700° to 1100° C., and the pressure may be preferably about 100 Torr.

Within a time of about 10 minutes, by selection of optimum growth conditions, grains 13 of single crystals of Si grow on the nucleation surfaces ($S_{NDS}$) 12 comprising silicon nitride layer or polycrystalline silicon layer on the $SiO_2$ layer as the center, and grow to sizes of 10 µm or more.

Subsequently, by the reactive ion etching (RIE) method utilizing the etching speed difference between Si and $SiO_2$, the surface of the single crystal 13A is flattened by selective etching of only Si, whereby a polycrystalline silicon layer 21 controlled in grain size can be formed (FIG. 12 D). Further, by removing the grain boundary portion, an island-shaped single crystalline silicon layer 15 is formed (FIG. 6 D). If unevenness on the surface of the single crystal grain 13 is large, mechanical polishing may be conducted before etching. When an electrical field effect transistor is formed according to a conventional semiconductor device preparation technique on the single crystal silicon layer 15 thus formed with a size of 10 µm or more, containing no grain boundary, characteristics not inferior to that formed on single silicon wafer are exhibited.

Also, mutual interference between the adjacent single crystal silicon layers 15 can be prevented, if they are electrically separated by an electrical insulator such as $SiO_2$, even if a complementary type electrical field effect transistor (C-MOS) may be constituted.

Also, since the thickness of the active layer of the device formed is thinner than the case when employing an Si wafer, there is no erroneous actuation by the charges generated when the device is irradiated. Further, due to lowering in unwanted capacity, sped-up operation of the device can be effected. Also, since any desired substrate can be used, a single crystal layer can be formed on a substrate of large area at lower cost than when employing an Si wafer. Further, since a single crystal layer can be formed also on other semiconductors, piezoelectric materials, dielectric materials, etc., a multi-functional three-dimensional integrated circuit can be realized. Thus, the present invention exhibits a number of excellent effects.

(Composition of Silicon Nitride)

For obtaining a sufficient nucleation density difference (AND) between the material for the formation of the nonnucleation surface ($S_{NDS}$) and the material for the formation of the nucleation surface ($S_{NDL}$) as described above, a polycrystalline silicon or $SiO_2$ can be used as the material for the formation of nonnucleation surface ($S_{NDS}$) when $SiO_2$ is used, the material for the formation of the nucleation surface ($S_{NDL}$) is not limited to $Si_3N_4$, but silicon nitrides with various chemical composition ratios may be employed.

The chemical composition ratio of silicon nitride may be varied as follows.

In the plasma CVD method for forming a silicon nitride film at low temperature by the decomposition of $SiH_4$ gas and $NH_3$ gas in RF plasma, by varying the flow rate ratio of $SiH_4$ gas and $NH_3$ gas, the composition ratio of Si and N in the deposited silicon nitride film can be varied to a great extent.

Figure 13:
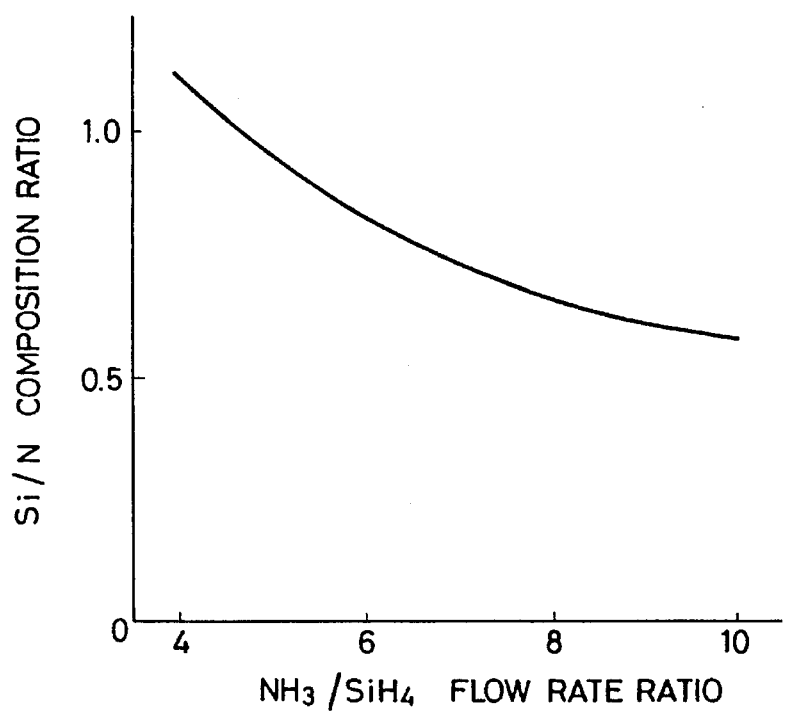
FIG. 13 is a graph showing the relationship between the flow rate of $SiH_4$ and $NH_3$ and the composition ratio of Si and N in the silicon nitride film formed.

FIG. 13 is a graph showing an example of the relationship between the flow rate ratio of $SiH_4$ and $NH_3$ and the composition ratio of Si and N in the silicon nitride film formed.

The deposition conditions at this time were an RF output of 175 W, a substrate temperature of 380° C. and the flow rate of $NH_3$ gas was varied with the $SiH_4$ gas flow rate being fixed at cc/min. As shown in the graph, by varying the gas flow rate ratio of $NH_3/SiH_4$ from 4 to 10, the Si/N ratio in the silicon nitride film was found to be varied from 1.1 to 0.58 according to Auger's electron spectrophotometry.

On the other hand, the composition of the silicon nitride film formed according to the reduced pressure CVD method by introducing $SiH_2Cl_2$ gas and $NH_3$ gas under the conditions of a reduced pressure of 0.3 Torr and a temperature of about 800° C., was found to be $Si_3N_4$ (Si/N=0.75) which is approximately the stoichiometric ratio.

Also, the silicon nitride film formed by heat treatment at about 1200° C. in ammonia or $N_2$ (hot nitrification method) can be obtained with a composition further approximate to the stoichiometric ratio, since the formation method is performed under thermal equilibrium.

By use of silicon nitrides formed by the various methods as described above as the material for forming nucleation surface ($S_{NDL}$) with higher nucleation density than $SiO_2$, the above nucleus of Si can be grown on the nucleation surface ($S_{NDL}$) comprising silicon nitride to form a Si single crystal based on the nucleation density (ΔND) corresponding to the chemical composition ratio of silicon nitride.

Figure 14:
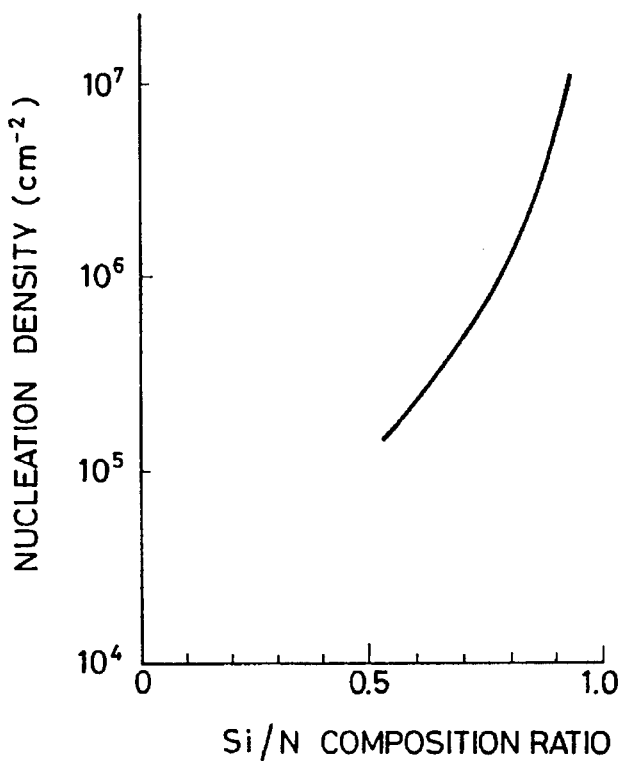
FIG. 14 is a graph showing the relationship between Si/N composition ratio and nucleation density.

FIG. 14 is a graph showing the relationship between Si/N composition ratio and nucleation density (ΔND). As shown in the same graph, by varying the chemical composition ratio of the silicon nitride film, the nucleation density of the Si single crystal nucleus formed thereon changes to a great extent. The nucleation conditions in the graph shown in FIG. 17 correspond to the case when a Si single crystal nucleus was formed by reacting $SiCl_4$ gas reduced to 175 Torr with $H_2$ at 1000° C. Of course, another graph will be obtained if nucleation conditions such as gas species, pressure, temperature, etc., are changed.

The phenomenon that the nucleation density thus changes according to the chemical composition ratio of silicon nitride affects the size (area) of the nucleation surface ($S_{NDL}$) when employing silicon nitride as the material for forming the nucleation surface ($S_{NDL}$) which is formed to be sufficiently small to the extent that a single nucleus may be grown. That is, when employing silicon nitride having a composition with great nucleation density (ND) only a single crystal can be formed on the nucleation surface ($S_{NDL}$) by forming the nucleation surface ($S_{NDL}$) extremely small as compared with the silicon nitride with a relatively smaller nucleation density (ND). Such a point is applicable as a similar tendency for other materials for forming a nucleation surface ($S_{NDL}$). Accordingly, in the present invention, for accomplishing its objects effectively, it is desirable to select a nucleation density (ND) and a size of the nucleation surface ($S_{NDL}$) formed of silicon nitride, etc., capable of forming only a single crystal suitably as desired. For example, under the nucleation condition for obtaining a nucleation density (ND) of about $10^5$ cm$^{-2}$ or less, it is possible to form selectively, only a single nucleus,.if the size of the nucleation surface ($S_{NDL}$) comprising silicon nitride is about 4 μm or less. The Si/N ratio in that case is about 0.5.

Formation of Nucleation Surface ($S_{NDL}$) by Ion Injection

As another method for realizing nucleation density difference when forming a Si single crystal nucleus by ion injection of Si, N, P, B, F, Ar, He, C, As, Ga, Ge, etc., may be effected locally onto the surface comprising $SiO_2$ which is a material for forming nonnucleation surface ($S_{NDS}$) with smaller nucleation density to form a modified region with a desired size on the $SiO_2$ surface, and utilize this modified region as the nucleation surface ($S_{NDL}$) with greater nucleation density (ND).

For example, the $SiO_2$ layer surface is covered with a photoresist layer and the desired portions are exposed, developed and dissolved to have the $SiO_2$ layer surface exposed.

Subsequently, by use of $SiF_4$ gas as the source gas, Si ions are implanted onto the $SiO_2$ layer surface exposed at 10 keV at a density of $1\times10^{16}$~$1\times10^{18}$ cm$^{-2}$. The projected flying distance in this case is 114 Å, and the Si concentration on the exposed surface of $SiO_2$ layer reaches about $10^{22}$ cm$^{-3}$ or less. Since the $SiO_2$ layer is originally amorphous, the modified layer made excessively enriched in Si by injection of Si ions is also amorphous.

For formation of a modified region, ion injection can be effected with the use of a resist as the mask, but it is also possible to inject a narrowed Si ion beam selectively at a desired position on the $SiO_2$ layer surface within a desired area without use of a resist mark by use of a converged ion beam technique.

After having thus effected Si ion injection, by peeling of the resist on the remaining portion, a Si-excessive modified region is formed on the $SiO_2$ layer surface at a desired position with a desired size. On the modified region of the $SiO_2$ layer surface on which such a modified region is formed, a Si single crystal is permitted to grow in the vapor phase.

Figure 15:
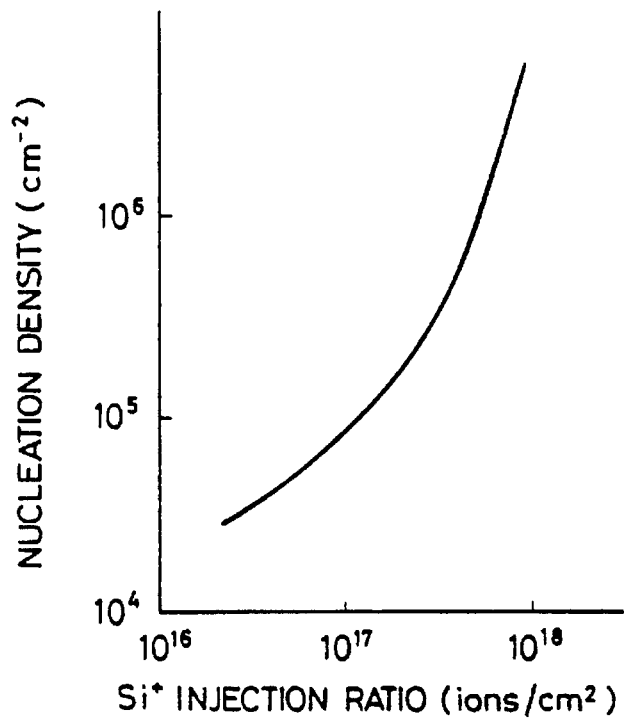
FIG. 15 is a graph showing the relationship between the injected amount of Si ions and nucleation density.

FIG. 15 is a graph showing the relationship between the amount of Si ions injected and the nucleation density (ND).

As shown in the graph, it can be understood that the nucleation density (ND) is increased as the amount of Si$^+$ injected is increased.

Accordingly, by forming a sufficiently small modified region, only a single nucleus of Si can be grown with the modified region being the nucleation surface ($S_{NDL}$), whereby a single crystal can be grown as described above.

This can be easily accomplished by patterning of a resist or narrowing of the beam of the converged ion beam to form a sufficiently small modified region to the extent that only a single nucleus may grow.

Method for Formation of Si Single Crystal Nucleus Other Than CVD

For growth of a single crystal by selective nucleation of Si, not only the CVD method, but also the method by evaporation of Si into a vacuum ($<10^{-6}$ Torr ) with an electron gun and deposition on a heated substrate may be used. Particularly, in the MBE (Molecular Beam Epitaxy) method which performs vapor deposition in an ultra-high vacuum ($<10^{-9}$ Torr), it has been known that an Si beam begins to react with $SiO_2$ at a substrate temperature of 900° C. or higher, whereby no nucleation of Si occurs on $SiO_2$ at all (T. Yonehara, S. Yoshioka and S. Miyazawa, Journal of Applied Physics 53, 10, p. 6839, 1983).

By utilizing this phenomenon, a single crystal nuclei of Si can be formed with perfect selectivity on the small silicon nitride regions permitted to exist in spots on the $SiO_2$ layer, and a single crystal Si can be grown thereon. The single crystal growth conditions as preferable example at this time may be, for example, a vacuum degree of $10^{-8}$ Torr or lower, a Si beam intensity of $9.7 \times 10^{14}$ atoms/$cm^2$·sec, and a substrate temperature of 900° C.~1000° C.

In this case, through the reaction $SiO_2 + Si \rightarrow 2SiO\uparrow$, a reaction product of SiO with a remarkably high vapor pressure is formed, and etching of $SiO_2$ itself with Si through this evaporation occurs.

In contrast, no such etching phenomenon as mentioned above occurs on silicon nitride, but nucleation of a Si single crystal and growth of a single crystal occur.

Accordingly, as the material for forming the nucleation surface ($S_{NDL}$) with high nucleation density (ND), tantalum oxide ($Ta_2O_5$), silicon nitride oxide (SION), etc., can be also used other than silicon nitride to obtain the same effect. That is, by forming the above nucleation surface ($S_{NDL}$) with these materials in small areas, single crystals of Si can be permitted to grow similarly.

Figure 16:
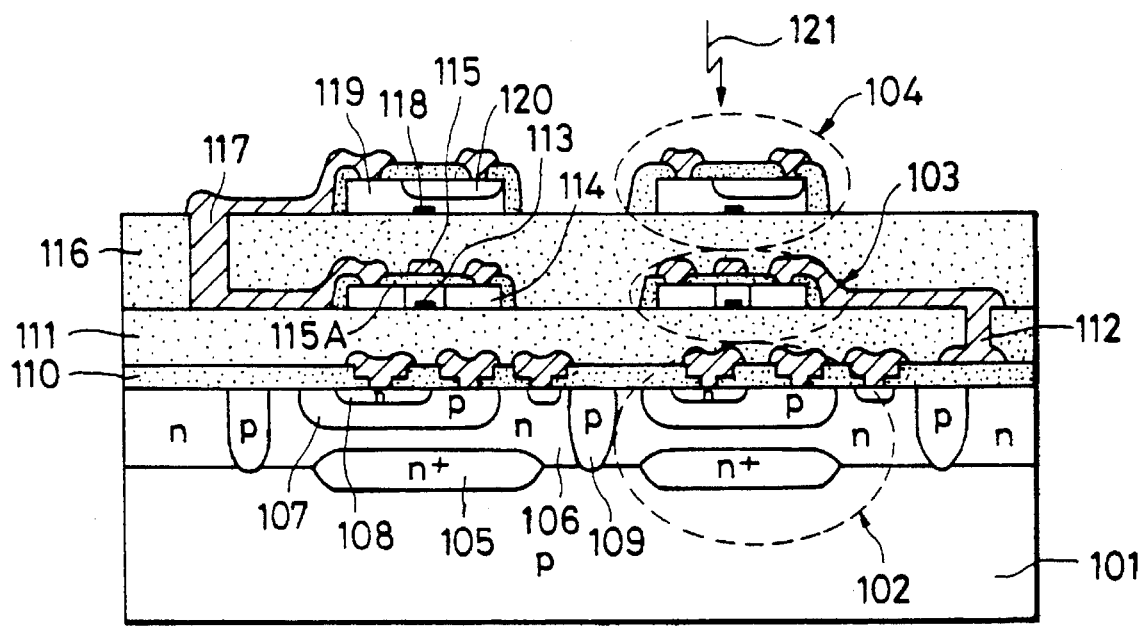
FIG. 16 is a sectional view showing an embodiment of the photoelectric conversion device according to the present invention.

FIG. 16 is a sectional view showing an embodiment of the photoelectric conversion device according to the present invention. In the Figure, there are laid on a p-type silicon substrate 101, a first layer formed with a bipolar transistor 102, a second layer formed with a MOS transistor 103 and a third layer (top layer) formed with a photodiode 104.

The bipolar transistor 102 of the first layer is formed in the substrate 101 using a conventional integrated circuit manufacturing process. First, a buried layer 105 is formed in the p-type substrate 101 by diffusing an impurity such as As, Sb or P. There is formed on the buried layer 105 an n-epitaxial layer 106 serving as a collector region.

A p-base region 107 is formed in the n-epitaxial layer 106 by diffusing an impurity such as boron. An $n^+$-emitter region 108 is formed in the p-base region by diffusing an impurity such as P or As. After forming a p-type element isolation region 109 by impurity diffusion, the whole surface is covered with an insulation layer 110. Contact holes are made to form an emitter electrode and a base electrode, and a collector electrode via an ohmic contact layer.

In this embodiment, then an interlayer insulation layer 111 is formed using $SiO_2$ which is not only a deposition surface forming material with a small nucleation density but also an insulation material. The interlayer insulation layer 111 is formed by the CVD method. It is preferable to further make the surface even by the known process.

Next, there is formed on the interlayer insulation layer 111 a nucleus forming region 113 of minute area, using a material having a sufficient nucleation density higher than that of $SiO_2$. In this embodiment, silicon nitride is used as such a material to form a p-type silicon monocrystalline layer 114 of 1.2 micron square to be later described, under a temperature of 700° to 1000° C. which does not deteriorate the characteristics of the bipolar transistor in the first layer.

Next, a gate insulation layer 115A on the p-type monocrystalline silicon layer 114 is formed to pattern the gate electrode 115. Thereafter, a source/drain region is formed through n-type impurity diffusion and other necessary interconnections are formed, to thereby complete the second layer having the n-channel MOS transistor.

Contact holes are opened in the interlayer insulation layer 111 to connect the MOS transistor 103 to the bipolar transistor 102 and the like via interconnections 112.

Next, an interlayer insulation layer 116 is formed on the second layer. An n-type monocrystalline silicon layer 119 is formed by the selective nucleus forming crystal grow method, using a nucleus forming region of a small area made of the above-described material. Succeedingly, a P-type region 120 is formed in the monocrystalline silicon layer 119 through p-type impurity diffusion, to thereby form the photodiode 104 with a pn junction. Contact holes are opened in the interlayer insulation layer 116 to connect the photodiode 104 to the MOS transistor in the lower layer via interconnections 117.

By forming a plurality of photodiodes 104 in the top layer, a photoelectric conversion device of good sensitivity can be realized because incident light can be applied efficiently to the photodiodes 104.

Further, since the monocrystalline silicon layer can be formed at a low temperature of the order of 700° to 1000° C., elements in the lower layer are not deteriorated in their characteristics. The mobility in channel of the MOS transistor 103 is larger than 400 $cm^2$/V sec, which is more than ten times of that of a conventional MOS transistor formed in a polysilicon layer.

Figure 17:
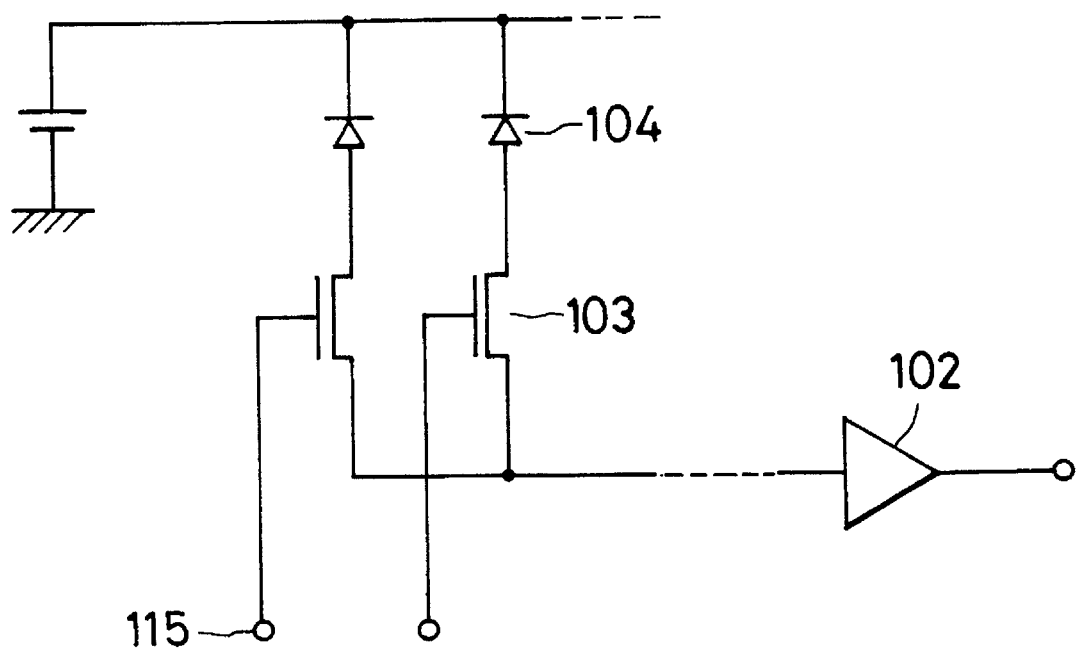
FIG. 17 is a circuit diagram of the embodiment.

FIG. 17 is an example of a fundamental circuit of the embodiment shown in FIG. 16. In the Figure, photodiodes 104 are arranged in an array, one end of which are applied with a source voltage and the other end are coupled via MOS transistors 103 to an amplifier 102 made of bipolar transistors. Outputs of the photodiodes are scanned in response to control signals applied to the gate electrodes 115 of the MOS transistors 103, and are serially sent to the amplifier 102.

In the above embodiment, since outputs from the photodiodes are processed by the high performance MOS transistors 103 and bipolar transistors in the monocrystalline layer, a high speed operation is possible.

Although a monocrystalline layer has been formed on the interlayer insulation layer in the above embodiment, a polysilicon layer may be formed as necessary. The process for forming a polysilicon layer has been described previously.

A three-layered structure has been employed in the above embodiment. It is obvious that the circuit section may be formed in a multi-layered structure having optional layers. For instance, a signal read section, a calculation section, a memory section and the like may be formed separately in a different layer.

Further, a photodiode has been used as a photosensor. Obviously, another type of photosensor such as a phototransistor may be used.

As described so far, the photoelectric conversion device of this embodiment improves the aperture ratio of the device and attains a high sensitivity. Further, by using the above-described method of forming a crystal layer, a monocrystal can be grown easily even on a substrate made of amorphous material. Thus, a high performance photosensor, field effect transistor, bipolar transistor and the like can be formed as a multi-layered integrated circuit structure. As a result, a photoelectric conversion device can be realized which operates at high speed and has various functions.

We claim:

1. A method for fabricating a photoelectric conversion device, said method comprising the steps of:

forming a substrate having a first semiconductor element of the photoelectric conversion device therein;

forming, on the substrate, an insulating layer of a first material;

forming, by deposition on a surface of the insulating layer, a seed of amorphous material different from the first material;

selecting a vapor deposition growth process in which the first material of the insulating layer has a nucleation density sufficiently smaller than a nucleation density of the amorphous material that substantially all crystal growth occurs on the amorphous material and substantially no crystal growth occurs on the insulating layer, the seed of amorphous material having an area sized so as to form only one nucleus during crystal growth in the selected vapor deposition crystal growth process;

applying the selected vapor deposition crystal growth process to grow the nucleus from the seed;

continuing the selected vapor deposition crystal growth process to grow, from the nucleus, a thin film single crystal layer over at least a portion of the surface of the insulating layer; and forming a photoelectric conversion device using the single crystal layer and including the first semiconductor element.

2. A method according to claim 1, wherein the vapor deposition is a chemical vapor deposition process.

3. A method according to claim 1, wherein the insulating layer is composed of $SiO_2$.

4. A method according to claim 1, wherein the seed is composed of $Si_3N_4$.

5. A method according to claim 1, wherein the semiconductor substrate comprises a silicon semiconductor.

6. A method according to claim 1, wherein said first semiconductor element comprises a signal amplifying element.

7. A method for fabricating a photoelectric conversion device, said method comprising the steps of:

forming a substrate having a first semiconductor element of the photoelectric conversion device therein;

forming, on the substrate, an insulating layer of a first material;

forming, on a surface of the insulating layer, a seed of amorphous material comprising a region of modified composition formed in an ion implantation process;

selecting a vapor deposition growth process in which the first material of the insulating layer has a nucleation density sufficiently smaller than a nucleation density of the amorphous material that substantially all crystal growth occurs on the amorphous material and substantially no crystal growth occurs on the insulating layer, the seed of amorphous material having an area sized so as to form only one nucleus during crystal growth in the selected vapor deposition crystal growth process;

applying the selected vapor deposition crystal growth process to grow the nucleus from the seed;

continuing the selected vapor deposition crystal growth process to grow, from the nucleus, a thin film single crystal layer over at least a portion of the surface of the insulating layer; and forming a photoelectric conversion device using the single crystal layer and including the first semiconductor element.

8. A method according to claim 7, wherein the vapor deposition is a chemical vapor deposition process.

9. A method according to claim 7, wherein the insulating layer is composed of $SiO_2$.

10. A method according to claim 7, wherein the seed is composed of $Si_3N_4$.

11. A method according to claim 7, wherein the semiconductor substrate comprises a silicon semiconductor.

12. A method according to claim 7, wherein said first semiconductor element comprises a signal amplifying element.

13. A method according to claim 1, wherein the nucleation density of the amorphous material is at least about 103 times the nucleation density of the first material.

14. A method according to claim 7, wherein the nucleation density of the amorphous material is at least about $10^3$ times the nucleation density of the first material.

* * * * *

UNITED STATES PATENT AND TRADEMARK OFFICE
CERTIFICATE OF CORRECTION

PATENT NO. : 5,610,094
DATED : March 11, 1997
INVENTOR(S) : MASAHARU OZAKI ET AL.          Page 1 of 3

It is certified that error appears in the above-identified patent and that said Letters Patent is hereby corrected as shown below: On the title page:

AT [56] REFERENCES CITED

Foreign Patent Documents
"60-178662  9/1985  Japan" should be deleted.

Other Publications, Under "W.A.P. Clausen,"
"Si3N4" should read --$Si_3N_4$--.

AT [57] ABSTRACT

Line 12, "high" should read --higher--.

COLUMN 2

Line 14, "rc" should read --$r_c$--.
Line 21, "ON" should read --on--.
Line 46, "an" should read --a--.

COLUMN 3

Line 22, "curvature" should read --of curvature--.
Line 50, "coalescing" should read --coalescing,--.
Line 51, "difficulty" should read --difficult--.

COLUMN 5

Line 49, "S" should be deleted.

COLUMN 6

Line 19, "become" should read --becomes--.
Line 48, "15" should be deleted.
Line 61, "a" (first occurrence) should be deleted.

UNITED STATES PATENT AND TRADEMARK OFFICE
CERTIFICATE OF CORRECTION

PATENT NO. : 5,610,094
DATED : March 11, 1997
INVENTOR(S) : MASAHARU OZAKI ET AL.

Page 2 of 3

It is certified that error appears in the above-identified patent and that said Letters Patent is hereby corrected as shown below:

COLUMN 7

Line 18, "the same" should read --these--.
Line 31, "FIGS. 12A2-12C" should read --FIGS. 12A-12C-- and "That," should read --That--.
Line 54, "polycrystal" should read --polycrystalline--.
Line 59, "polycrystal" should read --polycrystalline--.

COLUMN 8

Line 10, "desirable" should read --desirable,--.
Line 23, "less,." should read --less,--.
Line 44, "uneveness" should read --unevenness--.

COLUMN 9

Line 4, "(Composition" should read --Composition-- and "Nitride)" should read --Nitride--.
Line 7, "(AND)" should read --(AND)--.
Line 59, "17" should read --14--.

COLUMN 10

Line 18, "nucleus,.if" should read --nucleus, if--.

COLUMN 11

Line 39, "(SION)," should read --(SiON),--.

UNITED STATES PATENT AND TRADEMARK OFFICE
CERTIFICATE OF CORRECTION

PATENT NO.   :   5,610,094
DATED        :   March 11, 1997
INVENTOR(S)  :   MASAHARU OZAKI ET AL.

It is certified that error appears in the above-identified patent and that said Letters Patent is hereby corrected as shown below:

COLUMN 12

Line 23, "grow" should read --growth--.

COLUMN 14

Line 44, "103 times" should read --$10^3$ times--.

Signed and Sealed this

Twenty-eighth Day of April, 1998

Attest:

BRUCE LEHMAN

*Attesting Officer*        *Commissioner of Patents and Trademarks*